United States Patent
Kennan et al.

(10) Patent No.: US 9,013,237 B1
(45) Date of Patent: Apr. 21, 2015

(54) DISTRIBUTED TRANSCONDUCTANCE AMPLIFIER

(71) Applicant: M/A-COM Technology Solutions Holdings, Inc., Lowell, MA (US)

(72) Inventors: Wayne Kennan, Palo Alto, CA (US); Henrik Morkner, Palo Alto, CA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 63 days.

(21) Appl. No.: 13/927,593

(22) Filed: Jun. 26, 2013

Related U.S. Application Data

(60) Provisional application No. 61/825,633, filed on May 21, 2013.

(51) Int. Cl.
*H03F 3/60* (2006.01)
*H03F 3/193* (2006.01)

(52) U.S. Cl.
CPC .................. *H03F 3/193* (2013.01); *H03F 3/60* (2013.01); *H03F 3/605* (2013.01)

(58) Field of Classification Search
CPC .................................... H03F 3/60; H03F 3/605
USPC .............................................. 330/53, 54, 286
See application file for complete search history.

(56) References Cited

U.S. PATENT DOCUMENTS

| | | | |
|---|---|---|---|
| 4,540,954 A * | 9/1985 | Apel | 330/286 |
| 5,880,640 A | 3/1999 | Dueme | 330/303 |
| 6,788,148 B2 | 9/2004 | Orr et al. | 330/286 |
| 7,804,357 B2 * | 9/2010 | Shigematsu | 330/55 |
| 8,073,030 B2 | 12/2011 | Moto et al. | 372/38.02 |
| 2004/0124924 A1 * | 7/2004 | Claveau et al. | 330/286 |

* cited by examiner

*Primary Examiner* — Steven J Mottola
(74) *Attorney, Agent, or Firm* — Christopher P. Maiorana, PC

(57) ABSTRACT

An apparatus having an input transmission line, a plurality of amplifiers and an output transmission line is disclosed. The input transmission line may include a plurality of first inductors configured to receive an input voltage. The amplifiers may be configured to generate a plurality of intermediate currents by amplifying a plurality of intermediate voltages at a plurality of first nodes between the first inductors. The output transmission line generally includes a plurality of second inductors configured to generate an output current at an output node by combining the intermediate currents. Each of a plurality of second nodes connected to the second inductors may transfer a plurality of the intermediate currents. Each of the second inductors generally has a different one of a plurality of inductance values.

20 Claims, 9 Drawing Sheets

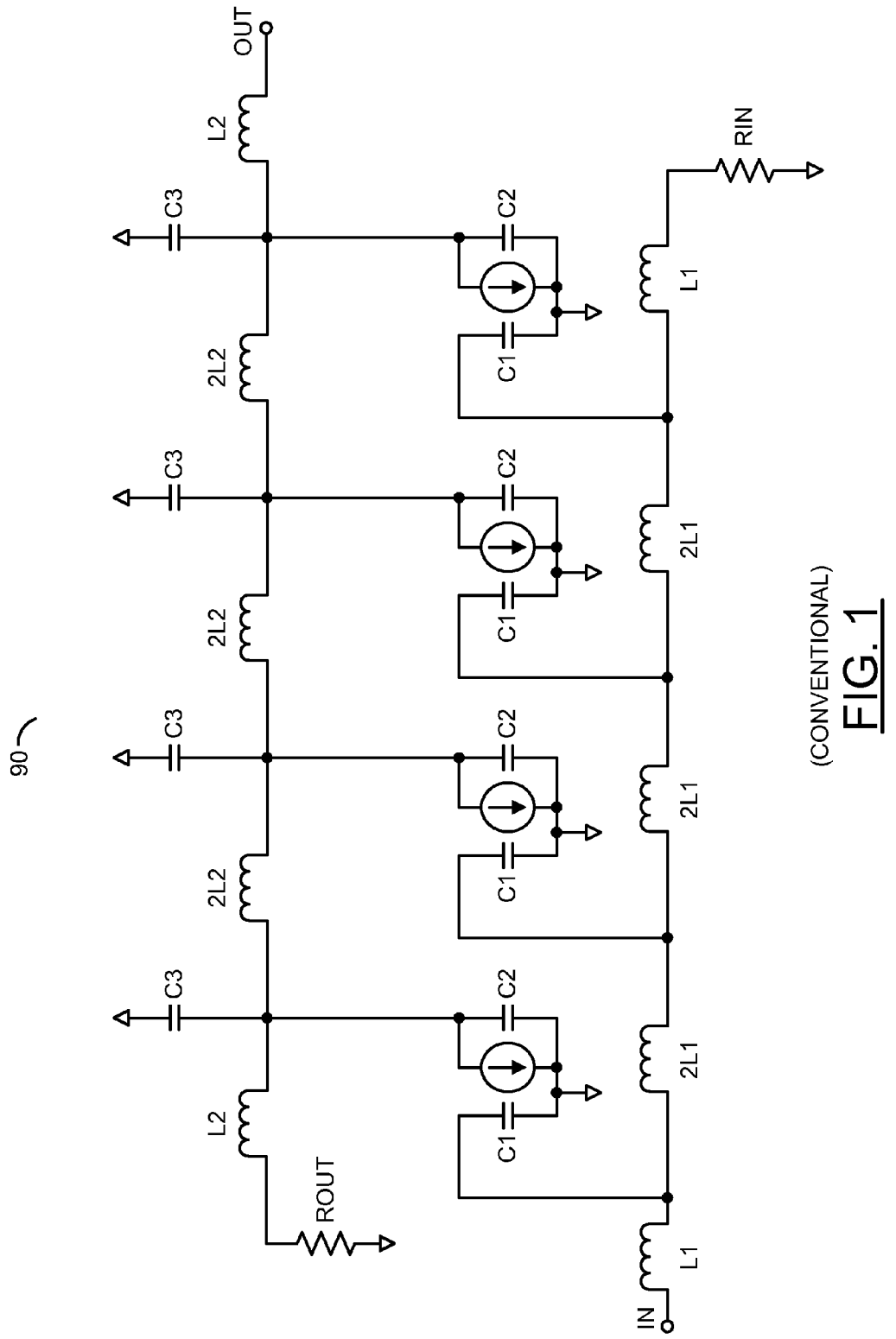
FIG. 1 (CONVENTIONAL)

DISTRIBUTED TRANSCONDUCTANCE AMPLIFIER

This application relates to U.S. Provisional Application No. 61/825,633, filed May 21, 2013, which is hereby incorporated by reference in its entirety.

FIELD OF THE INVENTION

The present invention relates to high-frequency amplifiers generally and, more particularly, to a method and/or apparatus for implementing a distributed transconductance amplifier.

BACKGROUND OF THE INVENTION

Distributed amplifiers are commonly employed for ultra-broad bandwidth applications. The amplifiers achieve a broad bandwidth by absorbing parasitic elements of transistors into lowpass artificial input and output transmission lines with shunt capacitances mainly provided by the transistors and series inductors added by a designer. Common designs typically have a transistor per "section" and the amplified current from each section adds in phase at the output of the amplifiers.

Referring to FIG. 1, a diagram of a conventional uniform distributed amplifier 90 is shown. Distributions in the amplifier 90 are uniform with series inductances, shunt capacitances, and transistors of uniform size in each section. Termination resistors are used on both the input lines and the output lines to flatten gain and present favorable impedances. On the input side, a bias voltage is often applied to the input transmission line through the input termination resistor because the current criterion is low and so a negligible voltage drop is created through the resistor. A conventional bias injection method on the output side uses large inductive bias chokes on the output line—either integrated, external, or a combination of both. The conventional methods are effective, but external inductors are expensive and occupy very large circuit board area in cases where the amplifier extends to low frequencies. With uniform distributed amplifiers, the bias voltage on the output transmission line can also be applied through the output termination resistor if the current is relatively low, but cannot be implemented where no output line termination resistor is available.

It would be desirable to implement distributed transconductance amplifiers.

SUMMARY OF THE INVENTION

The present invention concerns an apparatus having an input transmission line, a plurality of amplifiers and an output transmission line. The input transmission line may include a plurality of first inductors configured to receive an input voltage. The amplifiers may be configured to generate a plurality of intermediate currents by amplifying a plurality of intermediate voltages at a plurality of first nodes between the first inductors. The output transmission line generally includes a plurality of second inductors configured to generate an output current at an output node by combining the intermediate currents. Each of a plurality of second nodes connected to the second inductors may transfer a plurality of the intermediate currents. Each of the second inductors generally has a different one of a plurality of inductance values.

The objects, features and advantages of the present invention include providing a distributed transconductance amplifier that may (i) provide broadband current into low impedance loads, (ii) provide high transconductance, (iii) occupy small die area, (iv) include bias injection circuits and/or (v) be implemented as an integrated circuit.

BRIEF DESCRIPTION OF THE DRAWINGS

These and other objects, features and advantages of the present invention will be apparent from the following detailed description and the appended claims and drawings in which:

FIG. 1 is a diagram of a conventional uniform distributed amplifier;

DETAILED DESCRIPTION OF THE PREFERRED EMBODIMENTS

Embodiments of the present invention generally relate to non-uniform distributed amplifiers for transconductance applications. Transconductance amplification may amplify and convert an input voltage into an output current delivered into a load. The distributed amplifiers generally comprise multiple (e.g., four or more) non-uniform sections distributed between an input transmission line and an output transmission line. An impedance of the input transmission line may range from a few ohms (e.g., 5 ohms—$\Omega$) to dozens of ohms (e.g., 50$\Omega$) or more (e.g., 200$\Omega$). An impedance of the output transmission line generally ranges from a few ohms (e.g., 10$\Omega$) to multiple ohms (e.g., 50$\Omega$). The amplifiers may include paired transistor outputs and one or more active current sources. The active current sources may be fabricated concurrently with the transistors and attached at the output nodes of the transistors to provide bias currents. The active bias circuits may be inserted at one or more nodes of the output transmission line such that current source shunt capacitances, such as an output shunt capacitance of each amplifier transistor, are absorbed into the output transmission line of the distributed amplifier.

Figure 2:
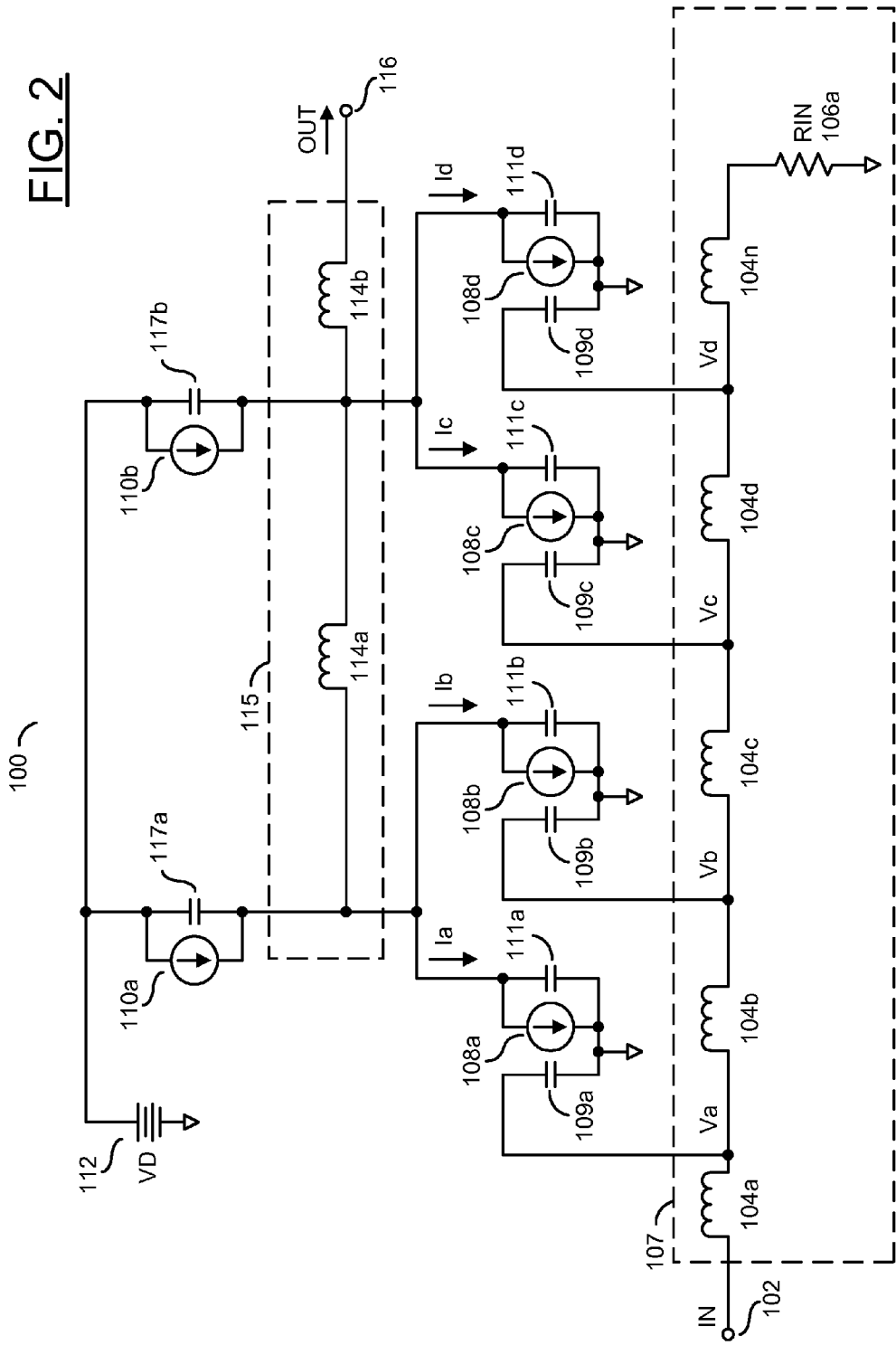
FIG. 2 is a block diagram of an apparatus in accordance with a preferred embodiment of the present invention.

Referring to FIG. 2, a block diagram of an apparatus 100 is shown in accordance with a preferred embodiment of the present invention. The apparatus (or circuit, device, component or integrated circuit) 100 may implement a non-uniform distributed transconductance amplifier. The circuit 100 generally comprises an input node (or port) 102, multiple inductors 104a-104n, a termination resistor (or impedance) 106a, one or more blocks (or circuits) 108a-108d, one or more blocks (or circuits) 109a-109d, one or more blocks (or circuits) 110a-110b, one or more blocks (or circuits) 111a-111d, a power source (or supply) 112, multiple inductors 114a-114b, an output node (or port) 116 and one or more blocks (or circuits) 117a-117b. The inductors 104a-104n and the resistor 106a may be connected in series to form an input transmission line 107. The inductors 114a-114b may be connected in series to form an output transmission line 115. The elements 104a to 117b may be implemented in hardware.

A signal (e.g., IN) may be received at the input node 102. The signal IN generally conveys an input voltage to be amplified by the circuit 100. The signal IN may be routed through the inductors 104a-104n and the resistor 106a. Multiple intermediate signals (e.g., Va to Vd) may be created along the input transmission line 107 at each node between the inductors 104a-104n. Each intermediate signal Va to Vd may be a voltage received by a respective circuit 108a-108d. Each circuit 108a-108d may generate a signal (e.g., Ia to Id). The signals Ia to Id may be current signals. Each current Ia to Id may be a transconductance amplified version of the respective voltages Va to Vd.

The currents Ia and Ib may be conveyed through a node at one end of the inductor 114a. The currents Ic and Id may be conveyed through a node at an end of the inductor 114a connected to the inductor 114b. A signal (e.g., OUT) may be generated at the output node 116 based on the currents Ia to Id. The signal OUT may be an output current delivered to a load connected to the output node 116. A supply voltage (e.g., VD) may be generated by the power source 112 and presented to the circuits 110a and 110b. The circuits 110a-110b may provide constant and/or variable bias currents from the power source 112 to the circuits 108a-108d.

Each inductor 104a and 104n may have a fixed inductance value (e.g., 0.2 nanohenrys—nH). The other inductors 104b-104d may have a different fixed inductance value (e.g., 0.4 nH or twice that of 104a and 104n). Other inductance values for the inductors 104a-104n may be implemented to meet the criteria of a particular application (e.g., 0.1 to 1 nH). The resistor 106a may have a fixed resistance (e.g., 50Ω). Other resistance values (e.g., 5 to 200Ω) may be implemented to meet the criteria of a particular application.

Each circuit 108a-108d may be implemented as a distributed section. The circuits 108a-108d are generally operational to generate the currents Ia to Id by transconductance amplification of the corresponding voltages Va to Vd. The circuits 108a-108d are shown represented in the figure as voltage controlled current sources with transconductance values (e.g., 50 milliSiemens—mS). Each circuit 108a-108d may have an input parasitic capacitance 109a-109d (e.g., 0.16 picofarads—pF) connected to a corresponding node of the input transmission line 107. Each circuit 108a-108d may have an output parasitic shunt capacitance 111a-111d (e.g., 0.02 pF) connected to the corresponding node of the output transmission line 115. Other transconductance values (e.g., 0.01 to 0.5 Siemens), input parasitic capacitance values (e.g., 0.05 to 0.5 pF) and/or other output parasitic capacitance values (e.g., 0.01 to 0.1 pF) may be implemented to meet the criteria of a particular application.

Each circuit 110a-110b may implement an active bias (or active load) circuit. The circuits 110a-110b may be scaled in size and are generally operational to provide fixed bias currents and/or variable bias currents from the power source 112 to the circuits 108a-108d. The circuits 110a-110b are shown represented as current sources with parasitic shunt capacitances 117a-117b (e.g., 0.19 pF and 0.39 pF, respectively). Other parasitic shunt capacitance values (e.g., 0.05 to 0.7 pF) may be implemented to meet the criteria of a particular application). The circuits 110a-110b may insert the bias currents at one or more of the output nodes of the circuits 108a-108d such that the current source shunt capacitances, like the output shunt capacitance of the circuits 108a-108d, are absorbed into the output transmission line 115 of the circuit 100. The circuits 110a-110b may be fabricated coincidentally with the circuits 108a-108d to minimize cost and die (or circuit board) area.

The inductor 114a may have a fixed inductance value (e.g., 0.2 nH). The inductor 114b may have a different fixed inductance value (e.g., 0.062 nH). Other inductance values (e.g., 0.01 to 0.5 nH) for the inductors 114a-114b may be implemented to meet the criteria of a particular application. The inductance values are generally "tapered" as seen moving toward the output node 116. The taper results in smaller inductance values closer to the output node 116 and larger inductance values further from the output node 116. The taper may also results in larger capacitance values closer to the output node 116 and smaller capacitance values further from the output node 116. The tapered impedance values along the output transmission line 115 generally cancel a given current traveling away from the output node 116. Therefore, the output transmission line 115 may lack a termination resistance connected to the inductor 114a due to the cancellation of the current.

The circuit 100 generally provides distributed amplifier circuits 108a-108d used as broadband transconductance amplifiers. The circuits 108a-108d may be connected to the tapered impedances along the output transmission line 115 with the series inductors (e.g., 114a-114b) and the shunt capacitors (e.g., 117a-117b) of varying values. By way of example, the tapered output transmission line 115 may have a characteristic impedance of 40 ohms at the node where the inductor 114a connects to the circuits 108a-108b and 10 ohms at the output node 116. Other impedances may be implemented to meet the criteria of a particular application. The circuit 100 may include paired output transistor connections (e.g., the circuit 108a paired with the circuit 108b and the circuit 108c paired with the circuit 108d). The paired connections may simplify a design of the output transmission line 115. The topology generally includes the tapered impedances, paired transistor outputs and active bias circuits.

Pairing the circuits 108a-108d at the connections to the output transmission line 115 generally results in a phase delta between the two output currents (e.g., Ia+Ib and Ic+Id) that change a transfer characteristic of a sum of the two sections. The modified transfer characteristic generally adds a factor that may be a reciprocal of the natural frequency dependent impedance variation along the input transmission line 107 caused by the lumped series inductor/shunt capacitor topology. A net benefit may be a flatter gain over a broader bandwidth than common designs. The output transmission line 115 of the circuit 100 is shown with two inductors and two capacitors. The design generally represents a reduction in loss and size with no degradation in gain or bandwidth compared with the common (non-paired) designs.

Figure 3:
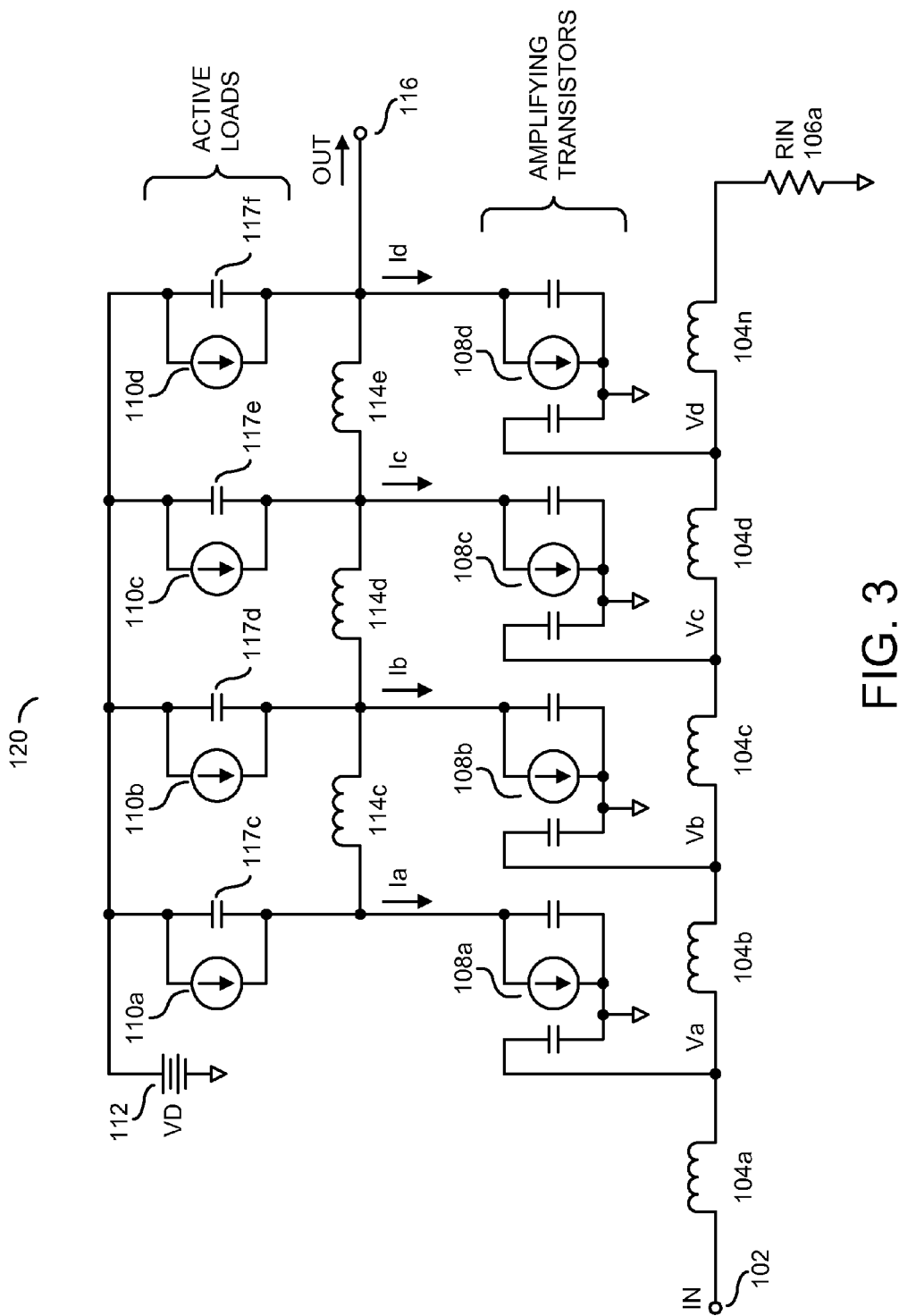
FIG. 3 is a block diagram of the apparatus with active loads.

Referring to FIG. 3, a block diagram of an apparatus 120 is shown. The apparatus (or circuit, device, component or integrated circuit) 120 may implement a non-uniform distributed transconductance amplifier. The circuit 120 may be a variation of the circuit 100. The circuit 120 generally comprises the input node 102, the inductors 104a-104n, the termination resistor 106a, the circuits 108a-108d, multiple blocks (or circuits) 110a-110d, the power source 112, multiple inductors 114c-114e, the output node 116 and multiple blocks (or circuits) 117c-117f. The inductors 104a-104n and the resistor 106a may be connected in series to form an input transmission line. The inductors 114c-114e may be connected in series to form an output transmission line. The elements 104a to 117f may be implemented in hardware.

The signal IN may be received at the input node 102. The signal IN may be routed through the inductors 104a-104n and the resistor 106a. The intermediate signals Va to Vd may be created along the input transmission line at each node between the inductors 104a-104n. Each intermediate signal Va to Vd may be received by a respective circuit 108a-108d. The circuits 108a-108d may generate the corresponding currents Ia-Id. Each current Ia to Id may be a transconductance amplified version of a respective voltage Va to Vd.

The current Ia may be conveyed through a node at one end of the inductor 114c. The current Ib may be conveyed through a node that connects the inductors 114c and 114d. A node between the inductors 114d and 114e may convey the current IC. The current Id may be conveyed through a node at an end of the inductor 114e that is connected to the output node 116. The signal OUT may be generated at the output node 116 based on the currents Ia to Id. The supply voltage VD may be generated by the power source 112 and presented to the circuits 110a-110d. The circuits 110a-110d may provide constant and/or variable bias currents from the power source 112 to the circuits 108a-108d. The circuits 110a-110d are shown represented as current sources with parasitic shunt capacitances 117c-117f (e.g., 0.18 pF, 0.38 pF, 0.58 pF and 0.38 pF, respectively). Other parasitic shunt capacitance values (e.g., 0.05 to 0.7 pF) may be implemented to meet the criteria of a particular application).

The circuits 108a-108d are shown represented in the figure as voltage controlled current sources with transconductance values (e.g., 50 mS). Other transconductance values (e.g., 0.01 to 0.5 Siemens) may be implemented to meet the criteria of a particular application.

The inductor 114c may have a fixed inductance value (e.g., 0.32 nH). The inductor 114d may have a different fixed inductance value (e.g., 0.16 nH). The inductor 114e may have yet a different inductance value (e.g., 0.107 nH). Other inductance values (e.g., 0.1 to 1 nH) for the inductors 114c-114e may be implemented to meet the criteria of a particular application. The inductance values are generally "tapered" as seen moving toward the output node 116. The taper results in smaller inductance values closer to the output node 116 and larger inductance values further from the output node 116. The taper may also result in larger capacitance values closer to the output node 116 and smaller capacitance values further from the output node 116. The tapered impedance values along the output transmission line generally cancel a given current traveling away from the output node 116. Therefore, the output transmission line may lack a termination resistance connected to the inductor 114a due to the cancellation of the current.

Figure 4:
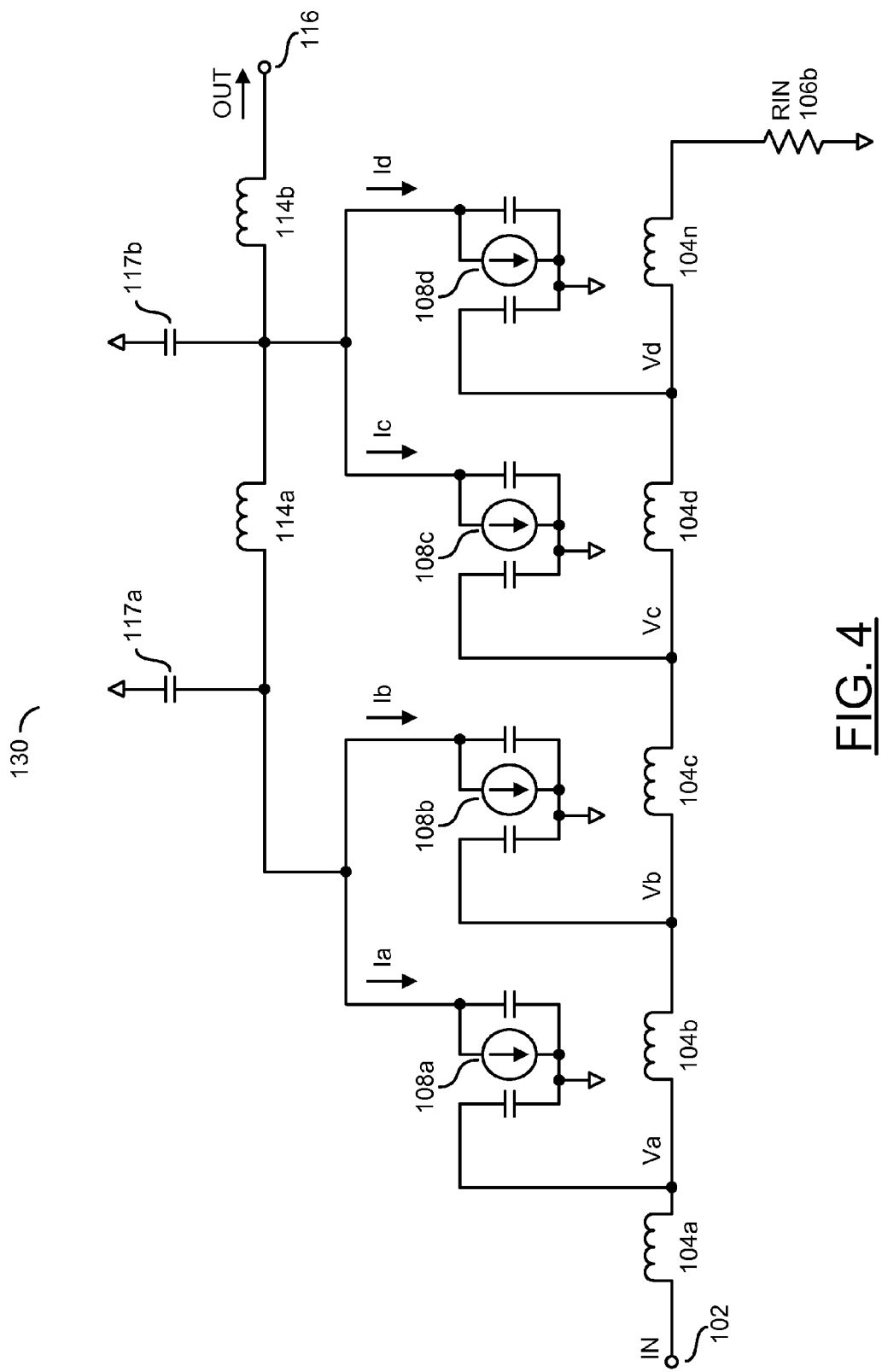
FIG. 4 is a block diagram of the apparatus with four sections.

Referring to FIG. 4, a block diagram of an apparatus 130 is shown. The apparatus (or circuit, device, component or integrated circuit) 130 may implement a non-uniform distributed transconductance amplifier. The circuit 130 may be a variation of the circuit 100 and/or the circuit 120. The circuit 130 generally comprises the input node 102, the inductors 104a-104n, a termination resistor (or impedance) 106b, the circuits 108a-108d, the power source 112, the inductors 114a-114b, the output node 116 and the capacitors 117a-117b. The inductors 104a-104n and the resistor 106b may be connected in series to form the input transmission line. The inductors 114a-114b may be connected in series to form the output transmission line. The elements 104a to 117b may be implemented in hardware.

The pair of capacitors 117a-117b (e.g., 0.19 pF and 0.39 pF) may be connected to the nodes of the output transmission lines in the same locations where the circuits 110a-110b connect in the circuit 100. The capacitors generally provide the same capacitance values as the parasitic shunt capacitors in the circuits 110a-110b. The capacitors may connect the output nodes to a signal ground. Other capacitance values (e.g., 0.01 to 0.7 pF) may be implemented to meet the criteria of a particular application. The resistor 106b may have a fixed resistance (e.g., 50Ω). Other resistance values (e.g., 5 to 200Ω) may be implemented to meet the criteria of a particular application.

Figure 5:
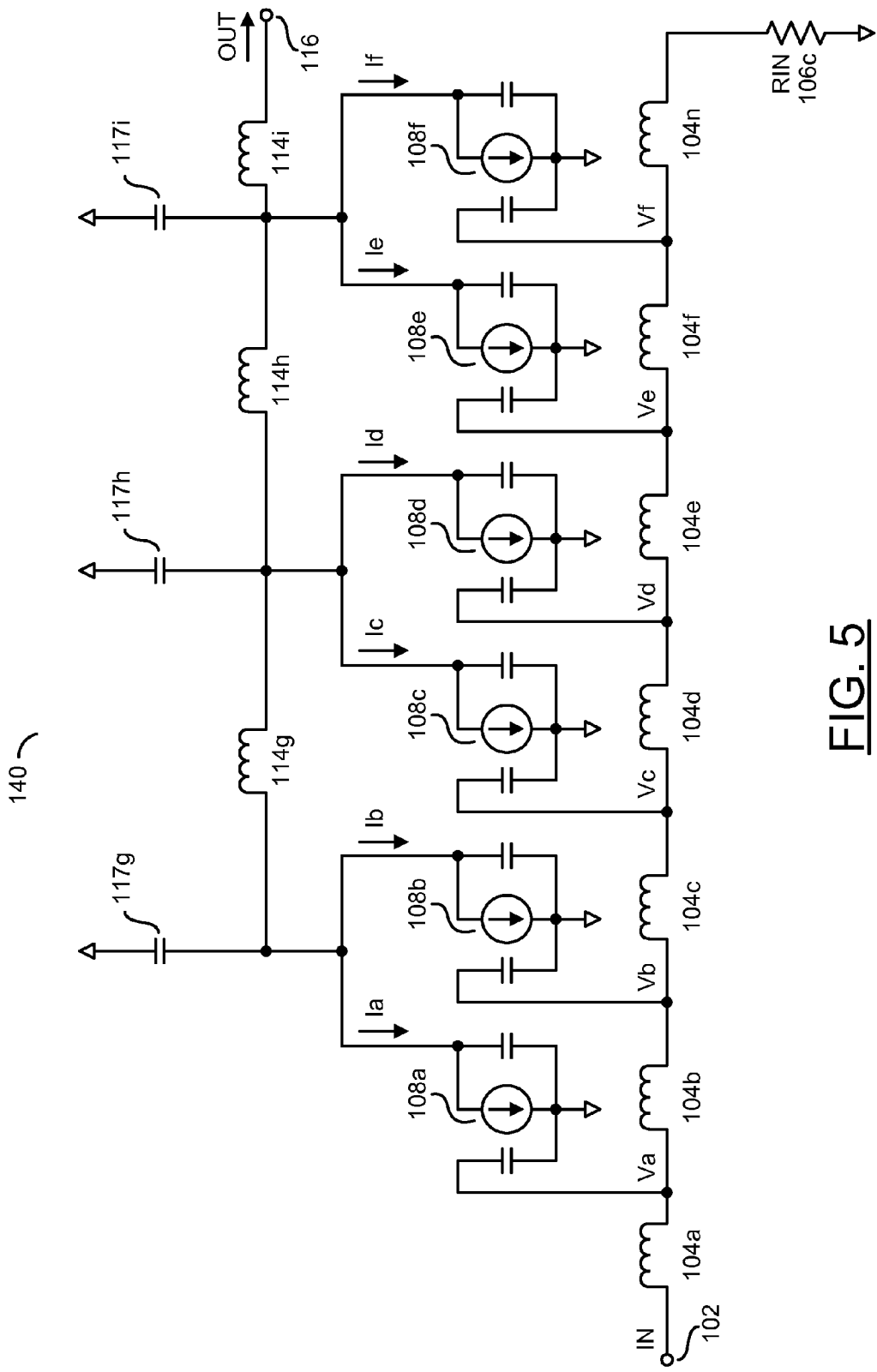
FIG. 5 is a block diagram of the apparatus with six sections.

Referring to FIG. 5, a block diagram of an apparatus 140 is shown. The apparatus (or circuit, device, component or integrated circuit) 140 may implement a non-uniform distributed transconductance amplifier. The circuit 140 may be a variation of the circuits 100, 120 and/or 130. The non-uniform distribution technique may be applied to amplifiers with more sections (e.g., six sections), as shown in the apparatus 140.

The circuit 140 generally comprises the input node 102, the inductors 104a-104n, a termination resistor (or impedance) 106c, multiple blocks (or circuits) 108a-108f, multiple inductors 114g-114i, the output node 116 and multiple blocks (or circuits) 117g-117i. The inductors 104a-104n and the resistor 106c may be connected in series to form the input transmission line. The inductors 114g-114i may be connected in series to form the output transmission line. The elements 104a to 117i may be implemented in hardware. Multiple (e.g., three) capacitors 117g-117l (e.g., 0.066 pF, 0.226 pF and 0.316 pF, respectively) may be connected between the nodes of the output transmission line and the signal ground. Other capacitance values (e.g., 0.01 to 1 pF) may be implemented to meet the criteria of a particular application.

The signal IN may be received at the input node 102. The signal IN may be routed through the inductors 104a-104n and the resistor 106c. Multiple intermediate signals (e.g., Va to Vf) may be created along the input transmission line at each node between the inductors 104a-104n. Each intermediate signal Va to Vf may be a voltage received by a respective circuit 108a-108f. The circuits 108a-108f may generate the corresponding currents Ia to If. Each current Ia to If may be a transconductance amplified version of a respective voltage Va to Vf.

The currents Ia and Ib may be conveyed through a node at an end of the inductor 114g. The currents Ic and Id may be conveyed through a node at an end of the inductor 114g connected to the inductor 114h. The currents Ie and If are generally conveyed through a node at an end of the inductor 114h connected to the inductor 114i. The signal OUT may be generated at the output node 116 based on the currents Ia to If.

Each inductor 104a and 104n may have a fixed inductance value (e.g., 0.2 nH). The other inductors 104b-104f may have a different fixed inductance value (e.g., 0.4 nH). Other inductance values (e.g., 0.1 to 1 nH) for the inductors 104a-104n may be implemented to meet the criteria of a particular application. In some embodiments, the inductor (e.g., 114i) connected directly to the output node 116 may be eliminated (e.g., zero inductance). The resistor 106c may have a fixed resistance (e.g., 50Ω). Other resistance values (e.g., 5 to 200Ω) may be implemented to meet the criteria of a particular application.

Each circuit 108a-108f may be implemented as a distributed section. The circuits 108a-108f are generally operational to generate the currents Ia to If by transconductance amplification of the corresponding voltages Va to Vf. The circuits 108a-108f are represented in the figure as voltage controlled current sources with transconductance values (e.g., 50 mS). Each circuit 108a-108f may have the input parasitic capacitance (e.g., 0.16 pF) connected to a corresponding node of the input transmission line. Each circuit 108a-108f may have the output parasitic shunt capacitance (e.g., 0.02 pF) connected to a corresponding node of the output transmission line. Other transconductance values (e.g., 0.01 to 0.5 Siemens), input parasitic capacitance values (e.g., 0.05 to 0.5 pF) and/or other output parasitic capacitance values (e.g., 0.01 to 0.1 pF) may be implemented to meet the criteria of a particular application. The six circuits 108a-108h may form three pairs (e.g., 108a-108b, 108c-108d and 108e-108f) that correspond to three of the nodes of the output transmission line.

The inductor 114g may have a fixed inductance value (e.g., 0.46 nH). The inductor 114h may have a different fixed inductance value (e.g., 0.16 nH). The inductor 114i may have yet a different inductance value (e.g., 0.068 nH). Other inductance values (e.g., 0.01 to 0.5 nH) for the inductors 114g-114i may be implemented to meet the criteria of a particular application. The inductance values are generally "tapered" as seen moving toward the output node 116. The taper results in smaller inductance values closer to the output node 116 and larger inductance values further from the output node 116. The taper may also results in larger capacitance values closer to the output node 116 and smaller capacitance values further from the output node 116. The tapered impedance values along the output transmission line generally cancel a given current traveling away from the output node 116. Therefore, the output transmission line may lack a termination resistance connected to the inductor 114a due to the cancellation of the current.

Figure 6:
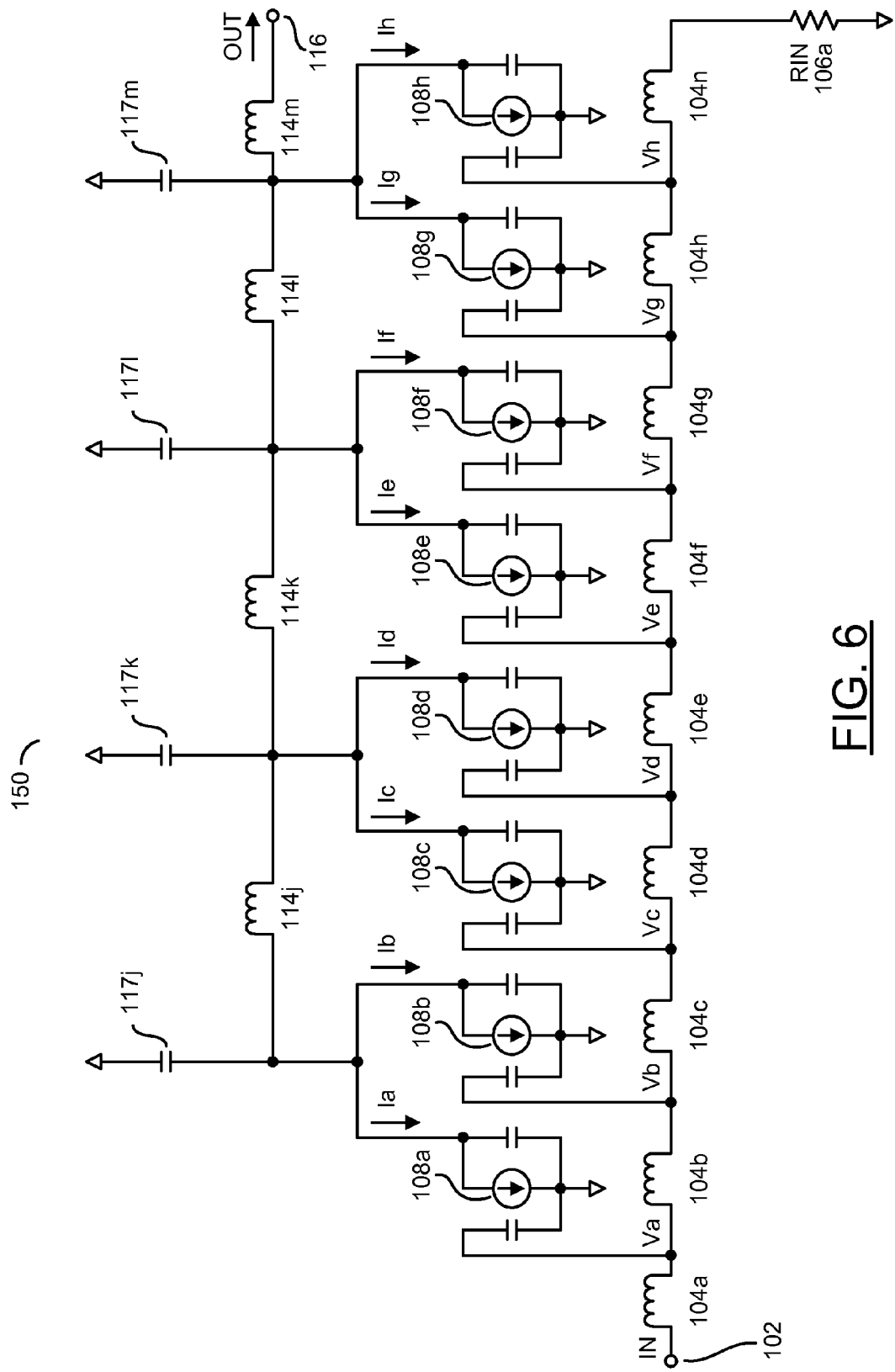
FIG. 6 is a block diagram of the apparatus with eight sections.

Referring to FIG. 6, a block diagram of an apparatus 150 is shown. The apparatus (or circuit, device, component or integrated circuit) 150 may implement a non-uniform distributed transconductance amplifier. The circuit 150 may be a variation of the circuits 100, 120, 130 and/or 140. The distribution technique may be applied to amplifiers with more sections (e.g., eight sections), as shown in the apparatus 150.

The circuit 150 generally comprises the input node 102, the inductors 104a-104n, the termination resistor 106a, multiple blocks (or circuits) 108a-108h, multiple inductors 114j-114m, the output node 116 and multiple blocks (or circuits) 117j-117m. The inductors 104a-104n and the resistor 106a may be connected in series to form the input transmission line. The inductors 114j-114m may be connected in series to form the output transmission line. The elements 104a to 114m may be implemented in hardware. Multiple (e.g., four) capacitors 117j-117m (e.g., 0.032 pF, 0.21 pF, 0.36 pF and 0.49 pF, respectively) may be connected between the nodes of the output transmission lines and the signal ground. Other capacitance values (e.g., 0.01 to 0.7 pF) may be implemented to meet the criteria of a particular application.

Each inductor 104a and 104n may have a fixed inductance value (e.g., 0.2 nH). The inductors 104b-104f may have a different fixed inductance value (e.g., 0.4 nH). Other inductance values (e.g., 0.1 to 1 nH) for the inductors 104a-104n may be implemented to meet the criteria of a particular application.

Each circuit 108a-108h may be implemented as a distribution section. The circuits 108a-108h are generally operational to generate the currents Ia to Ih by transconductance amplification of the corresponding voltages Va to Vh. The circuits 108a-108h are represented in the figure as voltage controlled current sources with transconductance values (e.g., 50 mS). Each circuit 108a-108h may have the input parasitic capacitance (e.g., 0.16 pF) connected to a corresponding node of the input transmission line. Each circuit 108a-108h may have the output parasitic shunt capacitance (e.g., 0.02 pF) connected to a corresponding node of the output transmission line. Other transconductance values (e.g., 0.01 to 0.5 Siemens), input parasitic capacitance values (e.g., 0.05 to 0.5 pF) and/or other output parasitic capacitance values (e.g., 0.01 to 0.1 pF) may be implemented to meet the criteria of a particular application. The eight circuits 108a-108h may form four pairs (e.g., 108a-108b, 108c-108d, 108e-108f and 108g-108h) that correspond to four of the nodes of the output transmission line.

The inductor 114j may have a fixed inductance value (e.g., 0.80 nH). The inductor 114k may have a different fixed inductance value (e.g., 0.27 nH). The inductor 114l may have yet a different inductance value (e.g., 0.15 nH). The inductor 114m generally has a different inductance value (e.g., 0.079 nH). Other inductance values (e.g., 0.01 to 0.5 nH) for the inductors 114j-114m may be implemented to meet the criteria of a particular application. The inductance values are generally "tapered" as seen moving toward the output node 116. The taper results in smaller inductance values closer to the output node 116 and larger inductance values further from the output node 116. The taper may also results in larger capacitance values closer to the output node 116 and smaller capacitance values further from the output node 116. The tapered impedance values along the output transmission line generally cancel a given current traveling away from the output node 116. Therefore, the output transmission line may lack a termination resistance connected to the inductor 114j due to the cancellation of the current.

Figure 7:
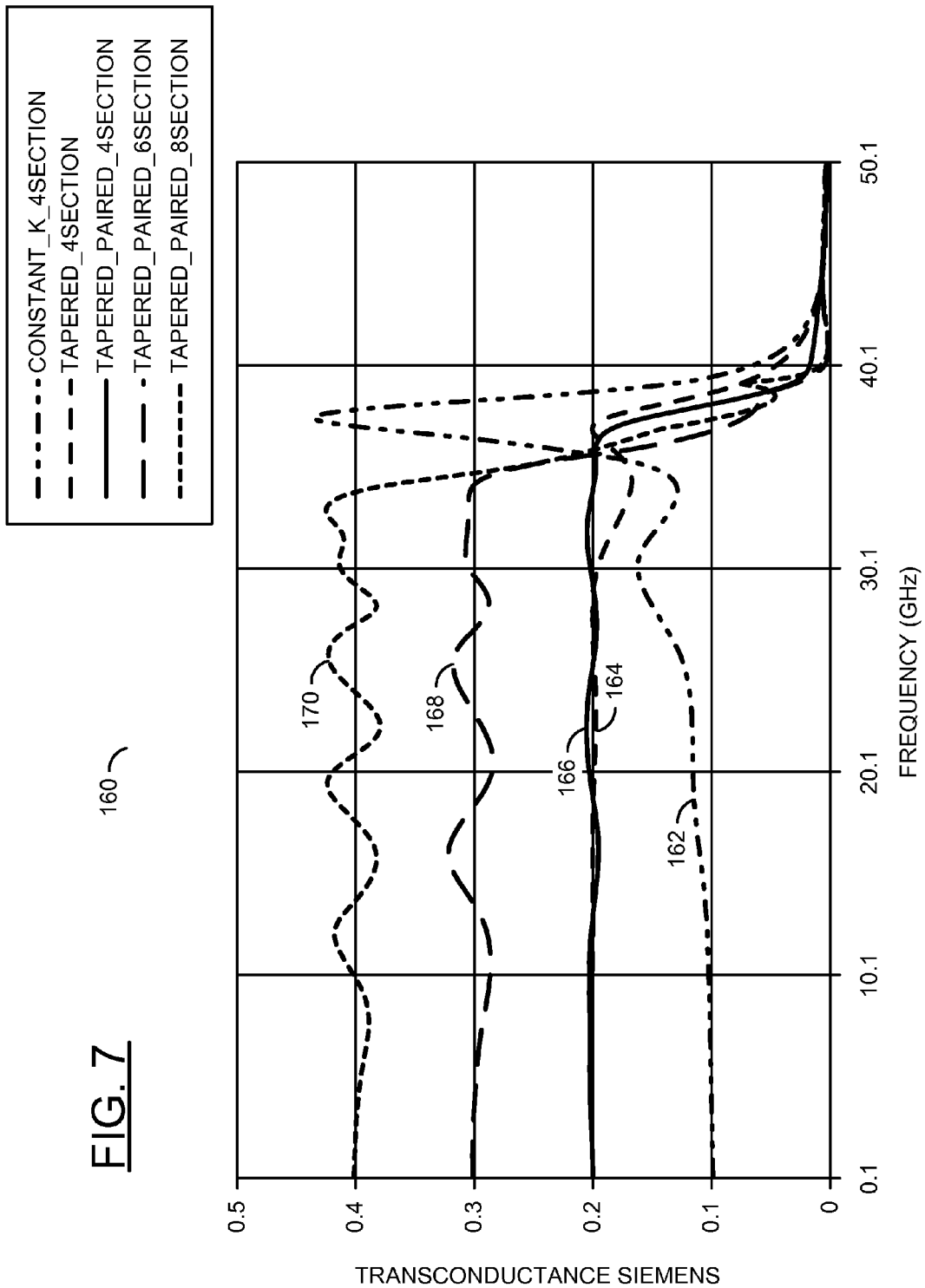
FIG. 7 is a graph of simulated transconductance curves.

Referring to FIG. 7, a graph 160 of simulated transconductance curves is shown. Each curve 162-170 generally presents the transconductance (e.g., in units of Siemens) of a corresponding circuit 90, 100, 140 and 150 over a frequency range (e.g., 0.1 to 50.1 gigahertz GHz). The simulations are made using the typical values of transconductance, capacitance, inductance, and resistance that have been presented. The curve 162 may represent a transconductance amplifier (e.g., the amplifier 90) having four constant (or uniform) sections. The curve 164 generally represents a transconductance amplifier having four tapered sections.

The curve 166 generally represents a transconductance amplifier (e.g., the circuit 100) having four paired tapered sections. The curve 166 shows an improvement in gain and bandwidth over the curves 162 and 164 up to a frequency of approximately 35 GHz.

The curve 168 generally represents a transconductance amplifier (e.g., the circuit 140) having six paired tapered sections. The curve 168 shows an improvement in gain over the curves 162, 164 and 166 up to a frequency of approximately 35 GHz.

The curve 170 generally represents a transconductance amplifier (e.g., the circuit 150) having eight paired tapered sections. The curve 170 shows an improvement in gain over the curves 162, 164, 166 and 168 up to a frequency of approximately 35 GHz.

Beyond the added bandwidth of paired section outputs, an additional benefit is generally realized when the connections of the paired sections are applied to non-uniform distributed amplifiers. The circuit 100 may have no changes to the input transmission line, a number of transistors, or an output impedance relative to the circuit 120. However, a range of the impedance tapering is generally reducible from 4:1 down to 2.95:1. Furthermore, fewer passive elements with lower total values may be used in the design. The total inductance in the output transmission line of the circuit 100 may be reduced from 0.59 nH down to 0.26 nH compared with the circuit 120, while the total shunt capacitance is reduced from 1.6 pF down to 0.66 pF, representing 56% and 59% reductions, respectively. The reductions generally provide advantages of reduced circuit area and reduced loss in addition to the enhanced bandwidth.

Figure 8:
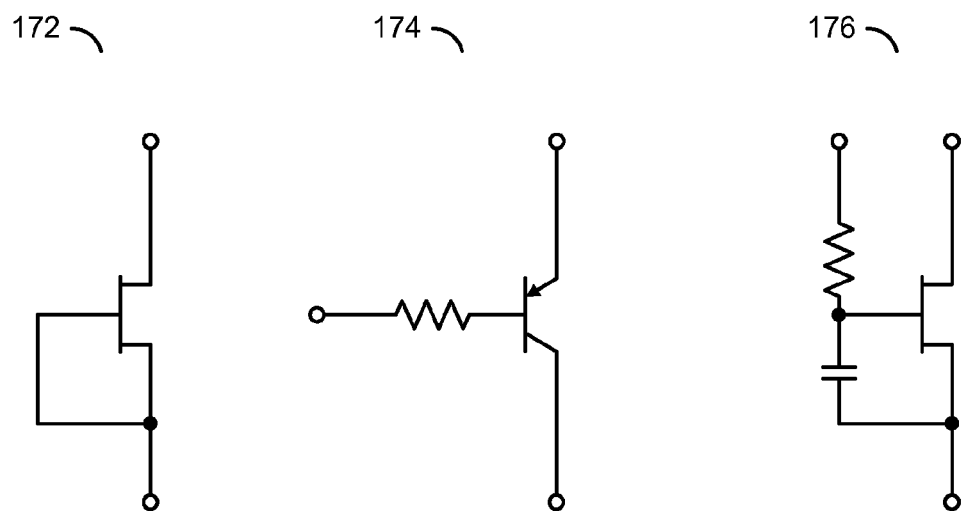
FIG. 8 is schematics of several example implementations of the active loads.

Referring to FIG. 8, schematics of several example implementations of the active loads are shown. The active load circuit elements (e.g., the circuits 110a-110d) may be constructed with multiple transistor types (e.g., field effect transistors, bipolar transistors, high-electron mobility transistors, etc.) in multiple technologies (e.g., silicon, gallium arsenide, silicon germanium, etc.) An example implementation may be a block (or circuit) 172 having an N-channel depletion mode field effect transistor with a gate tied to a source. Another example implementation may be a block (or circuit) 174 having a bipolar transistor with a resistor connected to a base. A further example implementation may be a block (or circuit) 176 having a field effect transistor with the gate connected to the source via a capacitor. The circuits 172-176 generally operate as current sources with a finite output resistance and a parasitic shunt capacitance. Because the capacitances are absorbed into the output transmission line, the parasitic capacitances do not limit a bandwidth of the amplifier and may be extended to an arbitrarily low frequency (e.g., a few hundred kilohertz) and an arbitrary high frequency (e.g., tens of gigahertz) with a proper choice of support passives like capacitors and inductors.

Figure 9:
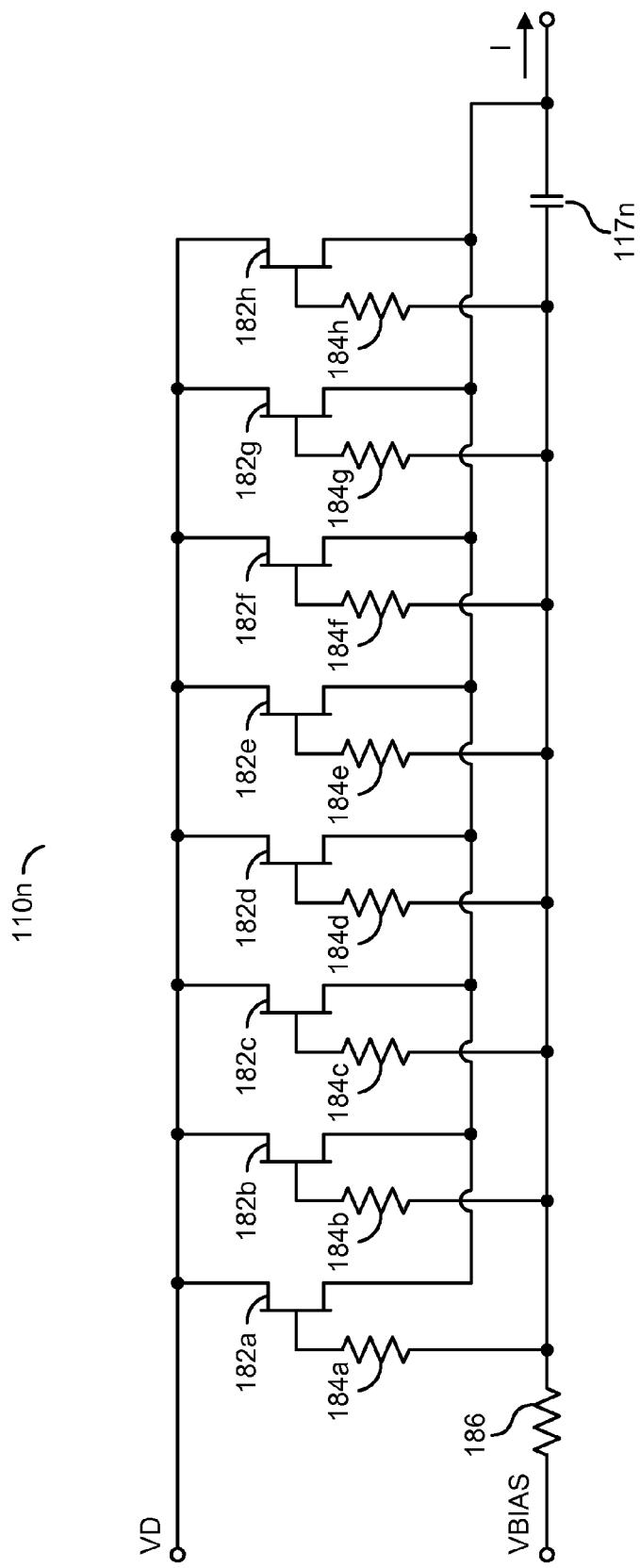
FIG. 9 is a schematic of an example implementation of an active load circuit.

Referring to FIG. 9, a schematic of an example implementation of a circuit 110n is shown. The circuit 110n may be representative of one or more of the active loads represented by the circuits 110a-110d. The circuit 110n generally comprises a block (or circuit) 117n, one or more blocks (or circuits) 182a-182h, one or more blocks (or circuits) 184a-184h and a block (or circuit) 186. The signal VD may be received by a node of each circuit 182a-182h. A bias signal (e.g., VBIAS) may be received by a node of the circuit 186. The signal VBIAS generally provides a bias voltage that is used to control the amount of current passing through the circuits 182a-182h. An output current signal (e.g., I) may be generated by a combination of the circuits 182a-182h. The signal I is generally applied to a node of the output transmission line 115.

Each circuit 182a-182h may be implemented as a transistor. The transistors 192a-182h are generally wired in parallel between a drain node that receives the signal VD and a source node that presents the signal I. In some embodiments, the transistors 182a-182h may be implemented as N-channel depletion mode field effect transistors. Other transistor technologies may be implemented to meet the criteria of a particular application.

Each circuit 184a-184h may be implemented as a resistive element (e.g., a resistor). Each resistor 184a-184h is connected between the circuit 186 and a respective gate of the circuits 182a-182h. In some embodiments, the resistors 184a-184h each have a resistance (e.g., 50Ω). Other resistor values (e.g., 2 to 200Ω) may be implemented to meet the criteria of a particular application.

The circuit 186 may be implemented as a resistive element (e.g., a resistor). The resistor 186 generally limits an amount of current drawn by the gates of the transistors 182a-182h.

The circuit 117n may be implemented as a capacitive element (e.g., a capacitor). The capacitor 117n generally provides an AC bypass for the voltage signals presented to the transistor gates. The capacitor 117n generally AC couples the gate bias voltage to the source voltage of the transistors 182a-182h. The capacitor 117n may be representative of the capacitors 117a to 117m.

The capacitor 117n may help ensure proper operation of the gate-source junctions of the transistors 182a-182h. To avoid stability issues at high frequencies, the resistors 184a-184h are connected to each gate to de-Q the AC bypass and minimize any connection inductance caused by lines (or traces) to the transistor gates. In some embodiments, one end of the capacitor 117n is connected with short metal lines to each individual resistor 184a-184h. The other end of the capacitor 117n may be connected with short metal lines to each individual source of the transistors 182a-182h. As illustrated, multiple (e.g., 8) transistors/resistor sets may be implemented. Other numbers of transistors/resistor sets may be implemented to meet the criteria of a particular application.

In some embodiments (e.g., FIGS. 2-6, 8 and 9), the active loads may be inserted at all section output nodes (as shown) or mixed with passive compensation, such as simple shunt capacitors, at the nodes. Varying shunt capacitances on the output transmission line may be implemented with active bias circuits of varying size. The transistors of the active loads, represented as voltage controlled current sources with input and output capacitances, may be implemented with many different technologies and with many different transistor configurations.

The distributed amplifiers may be designed with similar impedances at the input node and the output node (typically 50Ω). Furthermore, the distributed amplifiers provide broadband current into lower impedance loads for applications including, but not limited to, laser diode drivers and power amplifiers. The integrated transconductance amplifiers generally provide high transconductance, occupy small die area and/or include bias injection circuits.

The functions and structures illustrated in the diagrams of FIGS. 1-6, 8 and 9 may be designed, modeled and simulated using one or more of a conventional general purpose processor, digital computer, microprocessor, microcontroller and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors.

While the invention has been particularly shown and described with reference to the preferred embodiments thereof, it will be understood by those skilled in the art that various changes in form and details may be made without departing from the scope of the invention.

The invention claimed is:

1. An apparatus comprising:
an input transmission line comprising a plurality of first inductors configured to receive an input voltage;
a plurality of amplifiers configured to generate a plurality of intermediate currents by amplifications of a plurality of intermediate voltages at a plurality of first nodes between said first inductors;
an output transmission line comprising a plurality of second inductors configured to generate an output current at an output node as a combination of said intermediate currents, wherein (i) each of a plurality of second nodes connected to said second inductors transfers a plurality of said intermediate currents and (ii) each of said second inductors has a different one of a plurality of inductance values; and
one or more active loads configured to bias said second nodes with one or more currents.

2. The apparatus according to claim 1, wherein each of said second nodes transfers two of said intermediate currents.

3. The apparatus according to claim 1, wherein said inductance values and a plurality of capacitance values are tapered along said output transmission line to cancel a given current that travels away from said output node.

4. The apparatus according to claim 3, wherein said output transmission line lacks a termination resistance due to said cancellation of said given current.

5. The apparatus according to claim 3, wherein (i) an output inductor of said second inductors connected to an output node of said output transmission line has a smaller value of said inductance values than another of said second inductors and (ii) an output capacitor of a plurality of capacitors connected to said output node has a larger value of said capacitance values than another of said capacitors.

6. The apparatus according to claim 1, wherein each of said active loads comprises one or more transistors configured to generate one of said currents.

7. The apparatus according to claim 1, further comprising a plurality of capacitors each configured to couple a respective one of said second nodes to a signal ground, wherein each of said capacitors has a different one of a plurality of capacitance values.

8. The apparatus according to claim 1, wherein said apparatus is implemented as an integrated circuit.

9. A method for distributed transconductance amplification, comprising the steps of:
   (A) receiving an input voltage at an input transmission line comprising a plurality of first inductors;
   (B) generating a plurality of intermediate currents by amplifications of a plurality of intermediate voltages at a plurality of first nodes between said first inductors;
   (C) generating an output current at an output node as a combination of said intermediate currents in an output transmission line comprising a plurality of second inductors, wherein (i) each of a plurality of second nodes connected to said second inductors transfers a plurality of said intermediate currents and (ii) each of said second inductors has a different one of a plurality of inductance values; and
   (D) biasing said second nodes with one or more currents through one or more active loads.

10. The method according to claim 9, wherein each of said second nodes transfers two of said intermediate currents.

11. The method according to claim 9, wherein said inductance values and a plurality of capacitance values are tapered along said output transmission line to cancel a given current that travels away from said output node.

12. The method according to claim 11, wherein said output transmission line lacks a termination resistance due to said cancellation of said given current.

13. The method according to claim 11, wherein (i) an output inductor of said second inductors connected to an output node of said output transmission line has a smaller value of said inductance values than another of said second inductors and (ii) an output capacitor of a plurality of capacitors connected to said output node has a larger value of said capacitance values than another of said capacitors.

14. The method according to claim 9,
   wherein each of said active loads generates one of said currents with one or more transistors.

15. The method according to claim 9, further comprising the step of:
   coupling each of said second nodes to a signal ground through a respective capacitor, wherein each of said capacitors has a different one of a plurality of capacitance values.

16. An apparatus comprising:
   means for receiving an input voltage comprising a plurality of first inductors;
   means for generating a plurality of intermediate currents by amplifications of a plurality of intermediate voltages at a plurality of first nodes between said first inductors;
   means for generating an output current at an output node as a combination of said intermediate currents through a plurality of second inductors, wherein (i) each of a plurality of second nodes connected to said second inductors transfers a plurality of said intermediate currents and (ii) each of said second inductors has a different one of a plurality of inductance values; and
   means for active loading configured to bias said second nodes with one or more currents.

17. The apparatus according to claim 6, wherein each of said active loads further comprises a capacitor configured to couple a bias signal to a signal ground.

18. The apparatus according to claim 17, wherein each of said active loads further comprises one or more resistors configured to bias said transistors and connected respectfully between said transistors and said capacitor.

19. The method according to claim 14, wherein each of said active loads couples a bias signal to a signal ground through a capacitor.

20. The method according to claim 19, wherein each of said active loads biases said transistors with one or more resistors connected respectfully between said transistors and said capacitor.

* * * * *